United States Patent
Cheng et al.

(10) Patent No.: US 10,600,778 B2
(45) Date of Patent: Mar. 24, 2020

(54) METHOD AND APPARATUS OF FORMING HIGH VOLTAGE VARACTOR AND VERTICAL TRANSISTOR ON A SUBSTRATE

(71) Applicant: International Business Machines Corporation, Armonk, NY (US)

(72) Inventors: Kangguo Cheng, Schenectady, NY (US); Ruilong Xie, Schenectady, NY (US); Tenko Yamashita, Schenectady, NY (US); Chun-Chen Yeh, Danbury, CT (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 15/815,663

(22) Filed: Nov. 16, 2017

(65) Prior Publication Data

US 2019/0148360 A1    May 16, 2019

(51) Int. Cl.
*H01L 21/8234* (2006.01)
*H01L 27/06* (2006.01)
(Continued)

(52) U.S. Cl.
CPC ...... *H01L 27/0629* (2013.01); *H01L 21/0337* (2013.01); *H01L 21/76224* (2013.01); *H01L 21/76229* (2013.01); *H01L 21/823462* (2013.01); *H01L 21/823487* (2013.01); *H01L 29/0847* (2013.01); *H01L 29/6656* (2013.01); *H01L 29/66174* (2013.01); *H01L 29/66666* (2013.01); *H01L 29/7827* (2013.01); *H01L 29/78642* (2013.01); *H01L 29/93* (2013.01);
(Continued)

(58) Field of Classification Search
CPC .................................................. H01L 27/0629
USPC .......................................... 257/296; 438/238
See application file for complete search history.

(56) References Cited

U.S. PATENT DOCUMENTS 6,660,590 B2    12/2003    Yoo
6,809,396 B2    10/2004    Zdebel et al.
(Continued)

FOREIGN PATENT DOCUMENTS

CN    101276846 A    * 10/2008    ....... H01L 29/66075

OTHER PUBLICATIONS

List of IBM related Dockets, Appendix P, 2018.

*Primary Examiner* — Ajay Arora
(74) *Attorney, Agent, or Firm* — Garg Law Firm, PLLC; Rakesh Garg; Joseph Petrokaitis (57) ABSTRACT

Fabricating a semiconductor device includes receiving a substrate structure including a substrate. The substrate structure further includes a first bottom source/drain and a first fin formed on a vertical transistor portion of the substrate and a second bottom source/drain and a second fin formed on a varactor portion of the substrate. The substrate structure further includes a bottom spacer formed on the first bottom source/drain of the vertical transistor portion and the second bottom source/drain of the varactor portion. A mask is applied to the portion of the bottom spacer formed on the first bottom source/drain. The portion of the bottom spacer formed on the second bottom source/drain of the varactor portion is removed. The mask is removed from the portion of the bottom spacer formed on the first bottom source/drain. A gate oxide is deposited on the vertical transistor portion and the varactor portion.

14 Claims, 9 Drawing Sheets

(51) Int. Cl.
*H01L 29/66* (2006.01)
*H01L 21/762* (2006.01)
*H01L 29/08* (2006.01)
*H01L 21/033* (2006.01)
*H01L 29/78* (2006.01)
*H01L 29/93* (2006.01)
*H01L 29/786* (2006.01)
H01L 29/51 (2006.01)

(52) U.S. Cl.
CPC .... *H01L 21/823481* (2013.01); *H01L 29/513* (2013.01); *H01L 29/517* (2013.01)

(56) References Cited

U.S. PATENT DOCUMENTS

| | | |
|---|---|---|
| 6,846,709 B1 | 1/2005 | Lojek |
| 6,861,684 B2 | 3/2005 | Skotnicki et al. |
| 7,033,877 B2 | 4/2006 | Chaudhry et al. |
| 7,173,302 B2 | 2/2007 | Brederlow et al. |
| 7,449,389 B2 | 11/2008 | Meister et al. |
| 7,682,919 B2 | 3/2010 | Johansson |
| 7,696,040 B2 | 4/2010 | Zhu |
| 7,911,006 B2 | 3/2011 | Chaudhry et al. |
| 8,324,064 B2 | 12/2012 | Welch et al. |
| 8,498,094 B2 | 7/2013 | Marino et al. |
| 9,245,885 B1 | 1/2016 | Xie et al. |
| 9,666,578 B1 | 5/2017 | Anderson |
| 2015/0097220 A1* | 4/2015 | Ponoth ................ H01L 27/0629 257/296 |

* cited by examiner

METHOD AND APPARATUS OF FORMING HIGH VOLTAGE VARACTOR AND VERTICAL TRANSISTOR ON A SUBSTRATE

TECHNICAL FIELD

The present invention relates generally to a method, system, and computer program product for fabricating vertical transistors and varactors. More particularly, the present invention relates to a method, system, and computer program product for fabricating vertical transistors and high-voltage varactors on the same substrate on a common substrate and an apparatus formed by the method.

BACKGROUND

An integrated circuit (IC) is an electronic circuit formed using a semiconductor material, such as Silicon, as a substrate and by adding impurities to form solid-state electronic devices, such as transistors, diodes, capacitors, and resistors. Commonly known as a "chip" or a "package", an integrated circuit is generally encased in hard plastic, forming a "package". The components in modern day electronics generally appear to be rectangular black plastic packages with connector pins protruding from the plastic encasement. Often, many such packages are electrically coupled so that the chips therein form an electronic circuit to perform certain functions.

The software tools used for designing ICs produce, manipulate, or otherwise work with the circuit layout and circuit components on very small scales. Some of the components that such a tool may manipulate may only measure tens of nanometer across when formed in Silicon. The designs produced and manipulated using these software tools are complex, often including hundreds of thousands of such components interconnected to form an intended electronic circuitry.

A layout includes shapes that the designer selects and positions to achieve a design objective. The objective is to have the shape—the target shape—appear on the wafer as designed. However, the shapes may not appear exactly as designed when manufactured on the wafer through photolithography. For example, a rectangular shape with sharp corners may appear as a rectangular shape with rounded corners on the wafer.

Once a design layout, also referred to simply as a layout, has been finalized for an IC, the design is converted into a set of masks or reticles. A set of masks or reticles is one or more masks or reticles. During manufacture, a semiconductor wafer is exposed to light or radiation through a mask to form microscopic components of the IC. This process is known as photolithography.

The software tools used for designing ICs produce, manipulate, or otherwise work with the circuit layout and circuit components on very small scales. Some of the components that such a tool may manipulate may only measure tens of nanometer across when formed in Silicon. The designs produced and manipulated using these software tools are complex, often including hundreds of thousands of such components interconnected to form an intended electronic circuitry.

A Field Effect Transistor (FET) is a semiconductor device that has controls the electrical conductivity between a source of electric current (source) and a destination of the electrical current (drain). The FET uses a semiconductor structure called a "gate" to create an electric field, which controls the shape and consequently the electrical conductivity of a channel between the source and the drain. The channel is a charge carrier pathway constructed using a semiconductor material.

Many semiconductor devices are planar, i.e., where the semiconductor structures are fabricated on one plane. A non-planar device is a three-dimensional (3D) device where some of the structures are formed above or below a given plane of fabrication. A vertical transistor is a non-planar device having a thin vertical silicon "fin" inversion channel on top of the substrate allowing the gate to make a point of contact on the left and right sides of the fin. Source/drains (S/D) are formed on the top and bottom of the vertical fin and the current flows in a direction that is nominal to the substrate as opposed to a lateral flow found in planar semiconductor devices. A Vertical Field Effect Transistor (VFET) is a FET formed as a vertical transistor.

An on-chip varactor is a capacitor having a variable capacitance as a function of gate voltage. On-chip varactors are important for system-on-chip (SoC) applications such as a frequency modulator or frequency generator in an analog circuit. In conventional CMOS, varactors are formed using transistors with a gate oxide and a connected source/drain. The gate oxide is need for a high voltage varactor because analog circuits are typically operated at a voltage above the nominal operating voltage of digital circuits.

The illustrative embodiments recognize that in a vertical transistor architecture, it is nontrivial to form high voltage varactors for several reasons. First, a thin fin body results in a high resistance when the varactor is operated in a low capacitance regime. High resistance limits the operation frequency of a varactor. Second, relying on a fin body only to provide capacitance limits the capacitance density of the varactor. Back end of line (BEOL) Metal-insulator-metal (MIM) capacitors cannot be used as varactors because the capacitance of a typical MIM is essentially constant, i.e., not sensitive to operating voltage. The illustrative embodiments recognize a need for forming on-chip varactors along with vertical transistors on a common substrate.

SUMMARY

The illustrative embodiments provide a method, system, and computer program product. An embodiment of a method for fabricating a semiconductor device includes receiving a substrate structure including a substrate. In the embodiment, the substrate structure further includes a first bottom source/drain and a first fin formed on a vertical transistor portion of the substrate and a second bottom source/drain and a second fin formed on a varactor portion of the substrate. In the embodiment, the substrate structure further includes a bottom spacer formed on the first bottom source/drain of the vertical transistor portion and the second bottom source/drain of the varactor portion. The embodiment further includes applying a mask to the portion of the bottom spacer formed on the first bottom source/drain of the vertical transistor portion, and removing the portion of the bottom spacer formed on the second bottom source/drain of the varactor portion. The embodiment further includes removing the mask from the portion of the bottom spacer formed on the first bottom source/drain of the vertical transistor portion, and depositing a gate oxide on the vertical transistor portion and the varactor portion. An advantage offered by one or more embodiments includes increasing a capacitance density of a varactor by using not only a vertical fin body, but also a lateral source/drain to increase capacitance for a given device footprint.

An embodiment further includes depositing a gate dielectric on the vertical transistor region and the varactor region, forming a first metal gate on the gate dielectric of the vertical transistor region, and forming a second metal gate on the gate dielectric of the varactor region. An embodiment further includes forming a top spacer on the vertical transistor region and the varactor region.

An embodiment further includes forming a first top source/drain on the vertical transistor region, and forming a second top source/drain on the varactor region. In an embodiment, the first top source/drain and the second top source/drain are formed using an epitaxial process.

An embodiment further includes forming a first shallow trench isolation region adjacent to the first fin on the vertical transistor region, and forming a second shallow trench isolation region adjacent to the second fin on the varactor region.

An embodiment further includes forming a first hardmask on the first fin, and forming a second hardmask on the second fin. In an embodiment, applying the mask includes forming the block mask on the portion of the bottom spacer formed on the first bottom source/drain of the vertical transistor portion. In an embodiment, removing the portion of the bottom spacer formed on the second bottom source/drain of the varactor portion includes removing the portion of the bottom spacer formed on the second bottom source/drain using an etching process.

In an embodiment, removing the mask from the portion of the bottom spacer formed on the first bottom source/drain of the vertical transistor portion includes stripping the mask from the portion of the bottom spacer formed on the first bottom source/drain of the vertical transistor portion.

In an embodiment, the vertical transistor region includes a field effect transistor (FET). In an embodiment, the FET is a thick gate dielectric VFET. An embodiment further includes removing the gate oxide from the vertical transistor portion, wherein the FET is thin gate dielectric VFET. In an embodiment, the varactor region includes a high-voltage varactor.

An embodiment of an apparatus includes a substrate structure including a substrate. In the embodiment, the substrate structure further includes a first bottom source/drain and a first fin formed on a vertical transistor portion of the substrate and a second bottom source/drain and a second fin formed on a varactor portion of the substrate. In the embodiment, the substrate structure further includes a bottom spacer formed on the first bottom source/drain of the vertical transistor portion. In the embodiment, a gate oxide is deposited on the vertical transistor portion and the varactor portion, and a gate dielectric is deposited on the vertical transistor region and the varactor region. In the embodiment, a first metal gate is formed on the gate dielectric of the vertical transistor region, and a second metal gate formed on the gate dielectric of the varactor region. An advantage offered by one or more embodiments includes increasing a capacitance density of a varactor by using not only a vertical fin body, but also a lateral source/drain to increase capacitance for a given device footprint.

An embodiment further includes a top spacer formed on the vertical transistor region and the varactor region. An embodiment further includes a first top source/drain formed on the vertical transistor region, and a second top source/drain formed on the varactor region.

An embodiment further includes a first shallow trench isolation region adjacent to the first fin on the vertical transistor region, and a second shallow trench isolation region adjacent to the second fin on the varactor region.

An embodiment includes a computer usable program product. The computer usable program product includes one or more computer-readable storage devices, and program instructions stored on at least one of the one or more storage devices.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

DETAILED DESCRIPTION

The illustrative embodiments used to describe the invention generally address and solve the above-described problems and other problems related to fabricating vertical transistors and high-voltage varactors on the same substrate.

An embodiment can be implemented as a software application. The application implementing an embodiment can be configured as a modification of an existing fabrication system, as a separate application that operates in conjunction with an existing fabrication system, a standalone application, or some combination thereof. For example, the application causes the fabrication system to perform the steps described herein, to fabricate vertical transistors and high-voltage varactors on the same substrate.

For the clarity of the description, and without implying any limitation thereto, the illustrative embodiments are described using a two-gate vertical transistor and high-voltage varactor where the gates are coupled using a fin. An embodiment can be implemented with a different number of gates, different number of fins, or both, within the scope of the illustrative embodiments.

Furthermore, a simplified diagram of the example vertical transistors and high-voltage varactors are used in the figures and the illustrative embodiments. In an actual fabrication of a vertical transistor and a high-voltage varactor, additional structures that are not shown or described herein may be present without departing the scope of the illustrative embodiments. Similarly, within the scope of the illustrative embodiments, a shown or described structure in the example vertical transistors and high-voltage varactors may be fabricated differently to yield a similar operation or result as described herein.

Differently shaded portions in the two-dimensional drawing of the example vertical transistors and high-voltage varactors are intended to represent different structures in the example vertical transistors and a high-voltage varactors, as described herein. The different structures may be fabricated using suitable materials that are known to those of ordinary skill in the art.

A specific shape or dimension of a shape depicted herein is not intended to be limiting on the illustrative embodiments. The shapes and dimensions are chosen only for the clarity of the drawings and the description and may have been exaggerated, minimized, or otherwise changed from actual shapes and dimensions that might be used in actually fabricating a vertical transistor and a high-voltage varactor according to the illustrative embodiments.

Furthermore, the illustrative embodiments are described with respect to a vertical transistor and high-voltage varactor only as an example. The steps described by the various illustrative embodiments can be adapted for fabricating other planar and non-planar devices employing vertical transport in a similar manner, and such adaptations are contemplated within the scope of the illustrative embodiments.

An embodiment when implemented in an application causes a fabrication process to perform certain steps as described herein. The steps of the fabrication process are depicted in the several figures. Not all steps may be necessary in a particular fabrication process. Some fabrication processes may implement the steps in different order, combine certain steps, remove or replace certain steps, or perform some combination of these and other manipulations of steps, without departing the scope of the illustrative embodiments.

A method of an embodiment described herein, when implemented to execute on a device or data processing system, comprises substantial advancement of the functionality of that device or data processing system in fabricating vertical transistors and high-voltage varactors on the same substrate. For example, presently available methods for fabricating high-voltage varactors devices and vertical transistor devices do not allow a vertical transistor device (such as a VFET) and a high-voltage varactors device suitable for high frequency applications to be fabricated on the same substrate. An embodiment provides a method for fabricating high-voltage varactors devices suitable for high frequency applications and a vertical transistor device in such a manner that high-voltage varactors devices and vertical transistor devices can be fabricated on the same semiconductor substrate. Thus, a substantial advancement of such devices is in an improved fabrication of high-voltage varactors devices and vertical transistor devices in which it is desired to have a mixture of high-voltage varactor devices and vertical transistor devices on the same semiconductor substrate or wafer.

An advantage offered by one or more embodiments includes reducing resistance in an on-chip varactor by using a heavily doped bottom source/drain as part of the varactor. Even when the varactor is operated in a low capacitance ($C_{MIN}$) regime, the resistance is reduced due to the heavily doped low resistance source/drain. The resistance reduction enables the varactor for high frequency applications.

Another advantage offered by one or more embodiments includes increasing the capacitance density of the varactor by using not only a vertical fin body, but also a lateral source/drain to increase capacitance for a given device footprint.

The illustrative embodiments are described with respect to certain types of devices, contacts, layers, planes, structures, materials, dimensions, numerosity, data processing systems, environments, components, and applications only as examples. Any specific manifestations of these and other similar artifacts are not intended to be limiting to the invention. Any suitable manifestation of these and other similar artifacts can be selected within the scope of the illustrative embodiments.

The illustrative embodiments are described using specific code, designs, architectures, protocols, layouts, schematics, and tools only as examples and are not limiting to the illustrative embodiments. Furthermore, the illustrative embodiments are described in some instances using particular software, tools, and data processing environments only as an example for the clarity of the description. The illustrative embodiments may be used in conjunction with other comparable or similarly purposed structures, systems, applications, or architectures. For example, other comparable devices, structures, systems, applications, or architectures therefor, may be used in conjunction with such embodiment of the invention within the scope of the invention. An illustrative embodiment may be implemented in hardware, software, or a combination thereof.

The examples in this disclosure are used only for the clarity of the description and are not limiting to the illustrative embodiments. Additional data, operations, actions, tasks, activities, and manipulations will be conceivable from this disclosure and the same are contemplated within the scope of the illustrative embodiments.

Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

Figure 1:
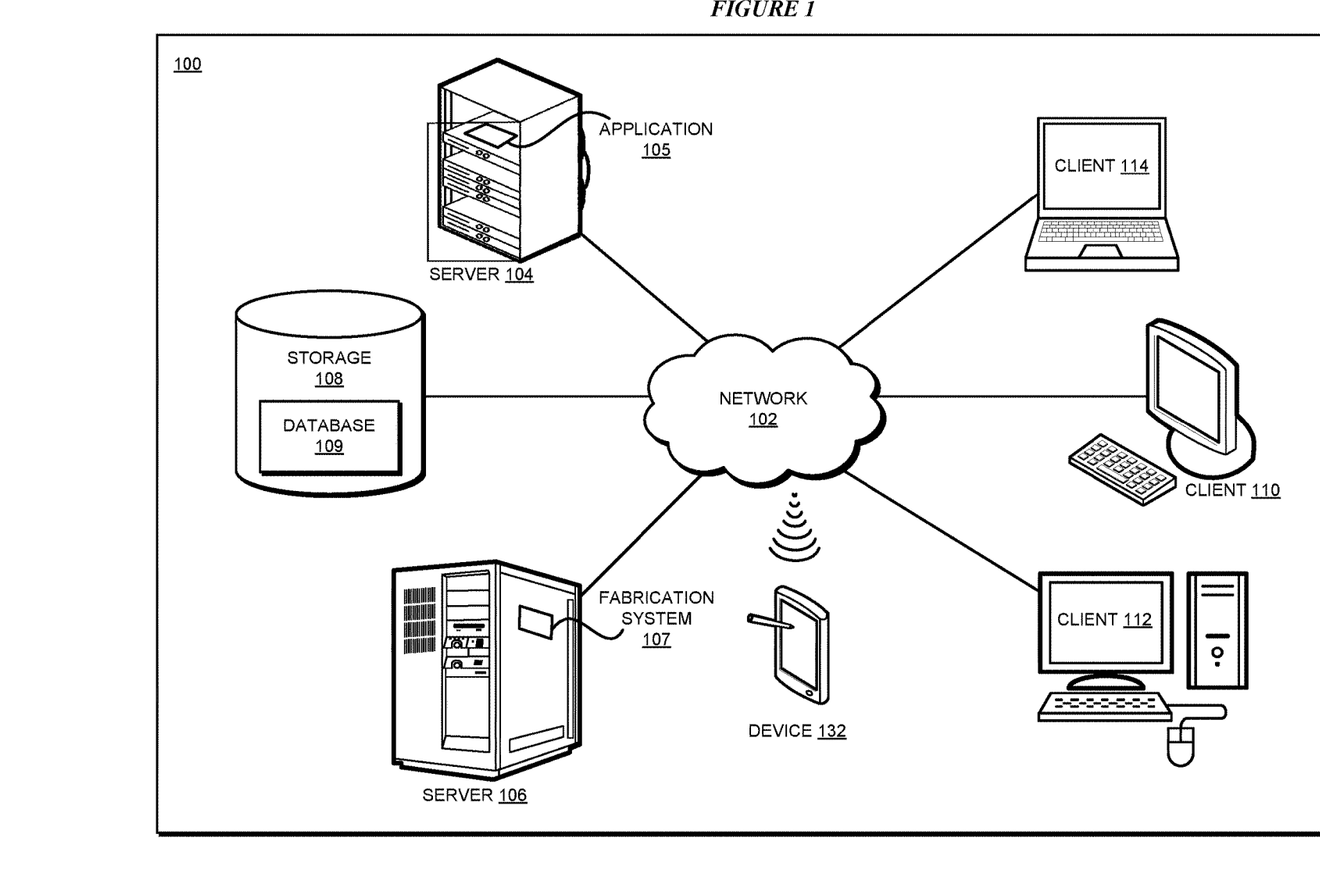
FIG. 1 depicts a block diagram of a network of data processing systems in which illustrative embodiments may be implemented.
Figure 2:
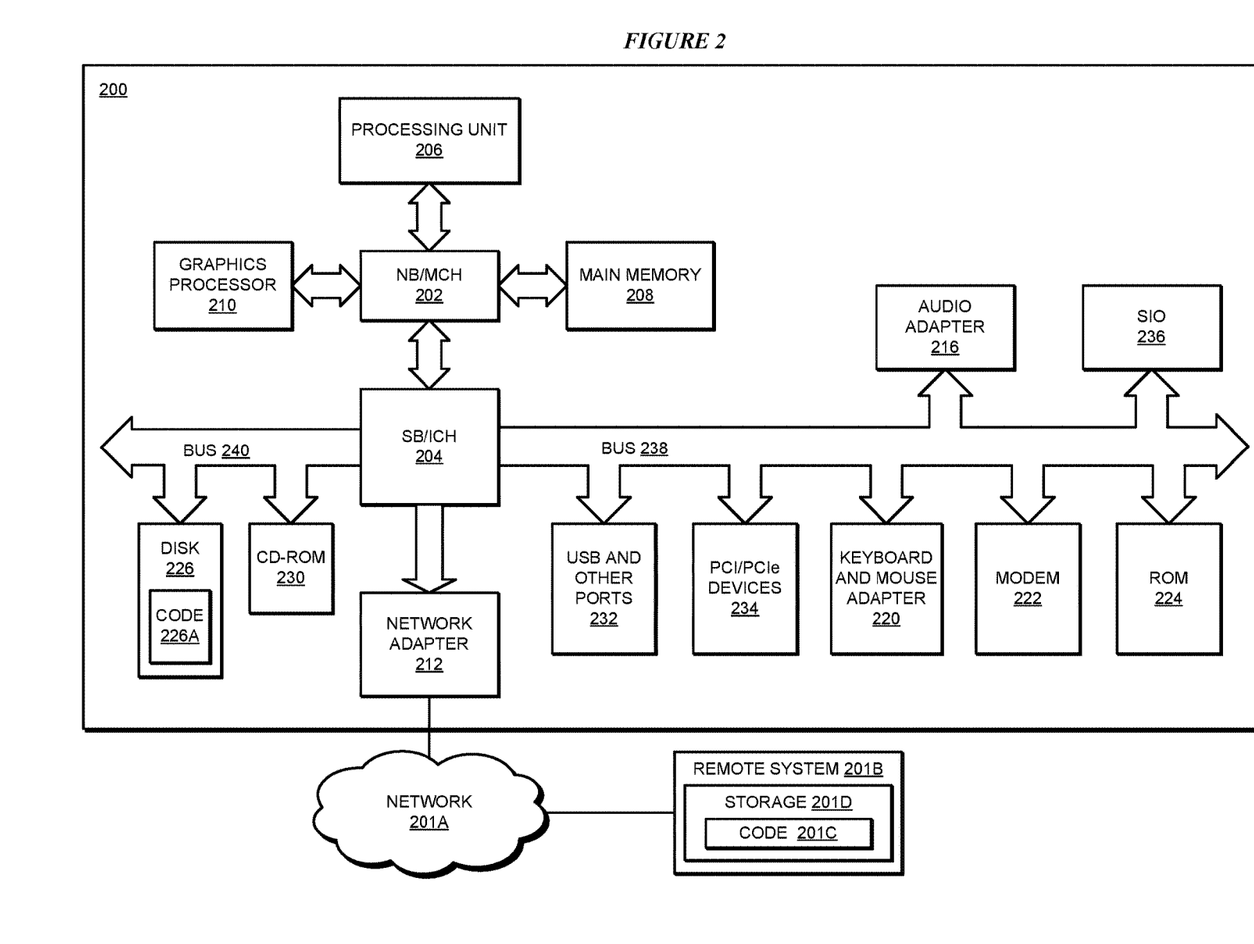
FIG. 2 depicts a block diagram of a data processing system in which illustrative embodiments may be implemented.

With reference to the figures and in particular with reference to FIGS. 1 and 2, these figures are example diagrams of data processing environments in which illustrative embodiments may be implemented. FIGS. 1 and 2 are only examples and are not intended to assert or imply any limitation with regard to the environments in which different embodiments may be implemented. A particular implementation may make many modifications to the depicted environments based on the following description.

FIG. 1 depicts a block diagram of a network of data processing systems in which illustrative embodiments may be implemented. Data processing environment 100 is a network of computers in which the illustrative embodiments may be implemented. Data processing environment 100 includes network 102. Network 102 is the medium used to provide communications links between various devices and computers connected together within data processing environment 100. Network 102 may include connections, such as wire, wireless communication links, or fiber optic cables.

Clients or servers are only example roles of certain data processing systems connected to network 102 and are not intended to exclude other configurations or roles for these data processing systems. Server 104 and server 106 couple to network 102 along with storage unit 108. Software applications may execute on any computer in data processing environment 100. Clients 110, 112, and 114 are also coupled to network 102. A data processing system, such as server 104 or 106, or client 110, 112, or 114 may contain data and may have software applications or software tools executing thereon.

Only as an example, and without implying any limitation to such architecture, FIG. 1 depicts certain components that are usable in an example implementation of an embodiment. For example, servers 104 and 106, and clients 110, 112, 114, are depicted as servers and clients only as example and not to imply a limitation to a client-server architecture. As another example, an embodiment can be distributed across several data processing systems and a data network as shown, whereas another embodiment can be implemented on a single data processing system within the scope of the illustrative embodiments. Data processing systems 104, 106, 110, 112, and 114 also represent example nodes in a cluster, partitions, and other configurations suitable for implementing an embodiment.

Device 132 is an example of a device described herein. For example, device 132 can take the form of a smartphone, a tablet computer, a laptop computer, client 110 in a stationary or a portable form, a wearable computing device, or any other suitable device. Any software application described as executing in another data processing system in FIG. 1 can be configured to execute in device 132 in a similar manner. Any data or information stored or produced in another data processing system in FIG. 1 can be configured to be stored or produced in device 132 in a similar manner.

Application 105 implements an embodiment described herein. Fabrication system 107 is any suitable system for fabricating a semiconductor device. Application 105 provides instructions to system 107 for fabricating one or more high-voltage varactors devices and vertical transistor devices upon a substrate in a manner described herein.

Servers 104 and 106, storage unit 108, and clients 110, 112, and 114 may couple to network 102 using wired connections, wireless communication protocols, or other suitable data connectivity. Clients 110, 112, and 114 may be, for example, personal computers or network computers.

In the depicted example, server 104 may provide data, such as boot files, operating system images, and applications to clients 110, 112, and 114. Clients 110, 112, and 114 may be clients to server 104 in this example. Clients 110, 112, 114, or some combination thereof, may include their own data, boot files, operating system images, and applications. Data processing environment 100 may include additional servers, clients, and other devices that are not shown.

In the depicted example, data processing environment 100 may be the Internet. Network 102 may represent a collection of networks and gateways that use the Transmission Control Protocol/Internet Protocol (TCP/IP) and other protocols to communicate with one another. At the heart of the Internet is a backbone of data communication links between major nodes or host computers, including thousands of commercial, governmental, educational, and other computer systems that route data and messages. Of course, data processing environment 100 also may be implemented as a number of different types of networks, such as for example, an intranet, a local area network (LAN), or a wide area network (WAN). FIG. 1 is intended as an example, and not as an architectural limitation for the different illustrative embodiments.

Among other uses, data processing environment 100 may be used for implementing a client-server environment in which the illustrative embodiments may be implemented. A client-server environment enables software applications and data to be distributed across a network such that an application functions by using the interactivity between a client data processing system and a server data processing system. Data processing environment 100 may also employ a service oriented architecture where interoperable software components distributed across a network may be packaged together as coherent business applications.

With reference to FIG. 2, this figure depicts a block diagram of a data processing system in which illustrative embodiments may be implemented. Data processing system 200 is an example of a computer, such as servers 104 and 106, or clients 110, 112, and 114 in FIG. 1, or another type of device in which computer usable program code or instructions implementing the processes may be located for the illustrative embodiments.

Data processing system 200 is also representative of a data processing system or a configuration therein, such as data processing system 132 in FIG. 1 in which computer usable program code or instructions implementing the processes of the illustrative embodiments may be located. Data processing system 200 is described as a computer only as an example, without being limited thereto. Implementations in the form of other devices, such as device 132 in FIG. 1, may modify data processing system 200, such as by adding a touch interface, and even eliminate certain depicted components from data processing system 200 without departing from the general description of the operations and functions of data processing system 200 described herein.

In the depicted example, data processing system 200 employs a hub architecture including North Bridge and memory controller hub (NB/MCH) 202 and South Bridge and input/output (I/O) controller hub (SB/ICH) 204. Processing unit 206, main memory 208, and graphics processor 210 are coupled to North Bridge and memory controller hub (NB/MCH) 202. Processing unit 206 may contain one or more processors and may be implemented using one or more heterogeneous processor systems. Processing unit 206 may be a multi-core processor. Graphics processor 210 may be coupled to NB/MCH 202 through an accelerated graphics port (AGP) in certain implementations.

In the depicted example, local area network (LAN) adapter 212 is coupled to South Bridge and I/O controller hub (SB/ICH) 204. Audio adapter 216, keyboard and mouse adapter 220, modem 222, read only memory (ROM) 224, universal serial bus (USB) and other ports 232, and PCI/PCIe devices 234 are coupled to South Bridge and I/O controller hub 204 through bus 238. Hard disk drive (HDD) or solid-state drive (SSD) 226 and CD-ROM 230 are coupled to South Bridge and I/O controller hub 204 through bus 240. PCI/PCIe devices 234 may include, for example, Ethernet adapters, add-in cards, and PC cards for notebook computers. PCI uses a card bus controller, while PCIe does not. ROM 224 may be, for example, a flash binary input/output system (BIOS). Hard disk drive 226 and CD-ROM 230 may use, for example, an integrated drive electronics (IDE), serial advanced technology attachment (SATA) interface, or variants such as external-SATA (eSATA) and micro-SATA (mSATA). A super I/O (SIO) device 236 may be coupled to South Bridge and I/O controller hub (SB/ICH) 204 through bus 238.

Memories, such as main memory 208, ROM 224, or flash memory (not shown), are some examples of computer usable storage devices. Hard disk drive or solid state drive 226, CD-ROM 230, and other similarly usable devices are some examples of computer usable storage devices including a computer usable storage medium.

An operating system runs on processing unit 206. The operating system coordinates and provides control of various components within data processing system 200 in FIG. 2. Instructions for the operating system and applications or programs, such as application 105 in FIG. 1, are located on storage devices, such as in the form of code 226A on hard disk drive 226, and may be loaded into at least one of one or more memories, such as main memory 208, for execution by processing unit 206. The processes of the illustrative embodiments may be performed by processing unit 206 using computer implemented instructions, which may be located in a memory, such as, for example, main memory 208, read only memory 224, or in one or more peripheral devices.

Furthermore, in one case, code 226A may be downloaded over network 201A from remote system 201B, where similar code 201C is stored on a storage device 201D. in another case, code 226A may be downloaded over network 201A to remote system 201B, where downloaded code 201C is stored on a storage device 201D.

The hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. In addition, the processes of the illustrative embodiments may be applied to a multiprocessor data processing system.

In some illustrative examples, data processing system 200 may be a personal digital assistant (PDA), which is generally configured with flash memory to provide non-volatile memory for storing operating system files and/or user-generated data. A bus system may comprise one or more buses, such as a system bus, an I/O bus, and a PCI bus. Of course, the bus system may be implemented using any type of communications fabric or architecture that provides for a transfer of data between different components or devices attached to the fabric or architecture.

A communications unit may include one or more devices used to transmit and receive data, such as a modem or a network adapter. A memory may be, for example, main memory 208 or a cache, such as the cache found in North Bridge and memory controller hub 202. A processing unit may include one or more processors or CPUs.

The depicted examples in FIGS. 1-2 and above-described examples are not meant to imply architectural limitations. For example, data processing system 200 also may be a tablet computer, laptop computer, or telephone device in addition to taking the form of a mobile or wearable device.

Where a computer or data processing system is described as a virtual machine, a virtual device, or a virtual component, the virtual machine, virtual device, or the virtual component operates in the manner of data processing system 200 using virtualized manifestation of some or all components depicted in data processing system 200. For example, in a virtual machine, virtual device, or virtual component, processing unit 206 is manifested as a virtualized instance of all or some number of hardware processing units 206 available in a host data processing system, main memory 208 is manifested as a virtualized instance of all or some portion of main memory 208 that may be available in the host data processing system, and disk 226 is manifested as a virtualized instance of all or some portion of disk 226 that may be available in the host data processing system. The host data processing system in such cases is represented by data processing system 200.

Figure 3:
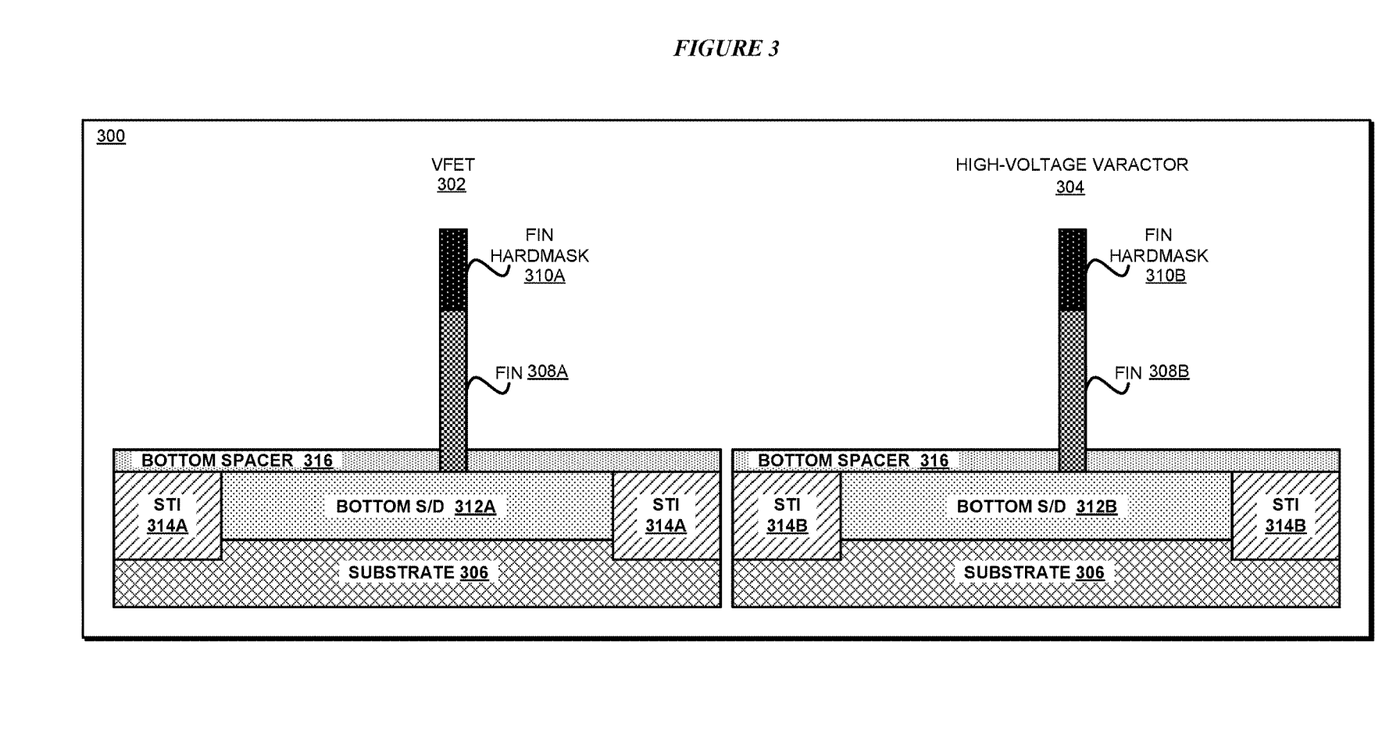
FIG. 3 depicts a portion of a process for fabricating a VFET and varactor upon a common substrate according to an illustrative embodiment.

With reference to FIG. 3, this figure depicts a portion of a process for fabricating a VFET and varactor upon a common substrate according to an illustrative embodiment. In the illustrative embodiment, a substrate structure 300 having a VFET region 302 and a varactor region 304 on a common substrate 306 is provided. In a particular embodiment, substrate 306 is formed of a silicon (Si) material or any other suitable substrate material. Substrate structure 300 includes a first vertical fin 308A formed on VFET region 302 and a second vertical fin 308B formed on varactor region 304 of substrate 306. In a particular embodiment, substrate 306 and vertical fins 308A-308B are formed of a common material. In some embodiments, substrate 306 and vertical fins 308A-308B may comprise different materials. For example, the substrate can be silicon while the vertical fins can be silicon germanium. A first fin hardmask 310A is formed on a top surface of first vertical fin 308A and a second hardmask 310B is formed on a top surface of second vertical fin 308B. In a particular non-limiting exemplary embodiment, first vertical fin 308A and second vertical fin 308B have dimensions of a lateral fin width of 4-10 nanometers (nm) and a vertical fin height of 20-60 nm.

A first bottom source drain (S/D) 312A is formed on VFET region 302 of substrate 306 and a second bottom source drain (S/D) 312B is formed on varactor region 304 of substrate 306. In particular embodiments, first bottom source drain (S/D) 312A and second bottom source drain (S/D) 312B are formed of a heavily-doped Si material that is doped with a dopant material such as phosphorus, arsenic, indium (for n-type transistor). In particular embodiments, first bottom source drain (S/D) 312A and second bottom source drain (S/D) 312B are formed of a heavily-doped silicon germanium (SiGe) or germanium (Ge) that is doped with a dopant material such as boron, gallium, antimony or other suitable dopant material (for p-type transistor). In a particular non-limiting exemplary embodiment, the dopant material has a dopant concentration of 1E19 to 2E21 $cm^{-3}$. Substrate structure 300 further includes a first shallow trench isolation (STI) region 314A formed in VFET region 302 adjacent to first vertical fin 308A and a second STI 314B region formed in varactor region 304 adjacent to second vertical fin 308B. In particular embodiments, STI regions 314A-314B can be formed by any suitable process including, for example, lithography or etching to form trenches, and then filling the trenches with an insulating material, such as silicon dioxide. STI regions 314A-314B provide isolation between neighboring source/drain structure regions of different semiconductor devices, such as separating a VFET device from a varactor device. Other suitable isolation techniques such as junction isolation can also be used.

Substrate structure 300 further includes a bottom spacer 316 formed on STI region 314A and bottom S/D 312A of VFET region 302 and STI region 314B and bottom S/D 312B of varactor region 304. In one or more embodiments, bottom spacer 316 is formed of a dielectric material such as silicon nitride. In various embodiments, at this point in the process, the VFET region 302 and varactor region 304 follow substantially the same process flow and have substantially the same structure. In a non-limiting exemplary embodiment, bottom spacer 316 has a thickness of 4-10 nm.

Figure 4:
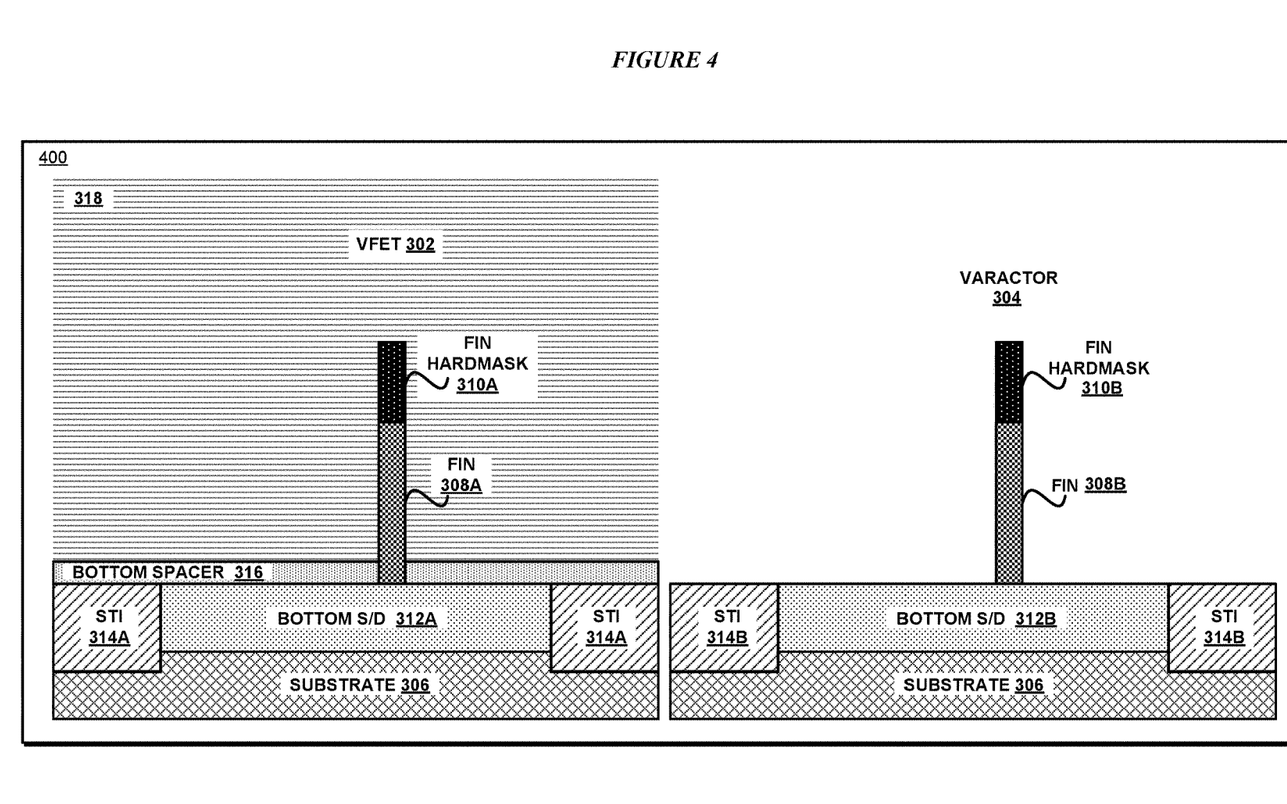
FIG. 4 depicts another portion of a process according to an illustrative embodiment.

With reference to FIG. 4, FIG. 4 depicts another portion of a process in which structure 400 is formed according to an illustrative embodiment. In the embodiment, fabrication system 107 forms a block mask 318 to cover VFET region 302 to selectively block bottom spacer 316 within VFET region 302 to protect the portion of bottom spacer 316 within VFET region 302 from a subsequent process. In a particular embodiment, block mask 318 is formed using a photolithographic or deposition/etch process. After formation of block mask 318, fabrication system 107 removes a portion of bottom spacer 316 within varactor region 304 by a removal process. In an embodiment, fabrication system 107 removes the portion of bottom spacer 316 within varactor region 304 by an etching process. In a particular embodiment, the portion of bottom spacer 316 within varactor region 304 is removed using a reactive-ion etching (RIE) process. Alternatively, the exposed bottom spacer in varactor region can be removed by other suitable techniques such as by an isotropic dry or wet etch process.

Figure 5:
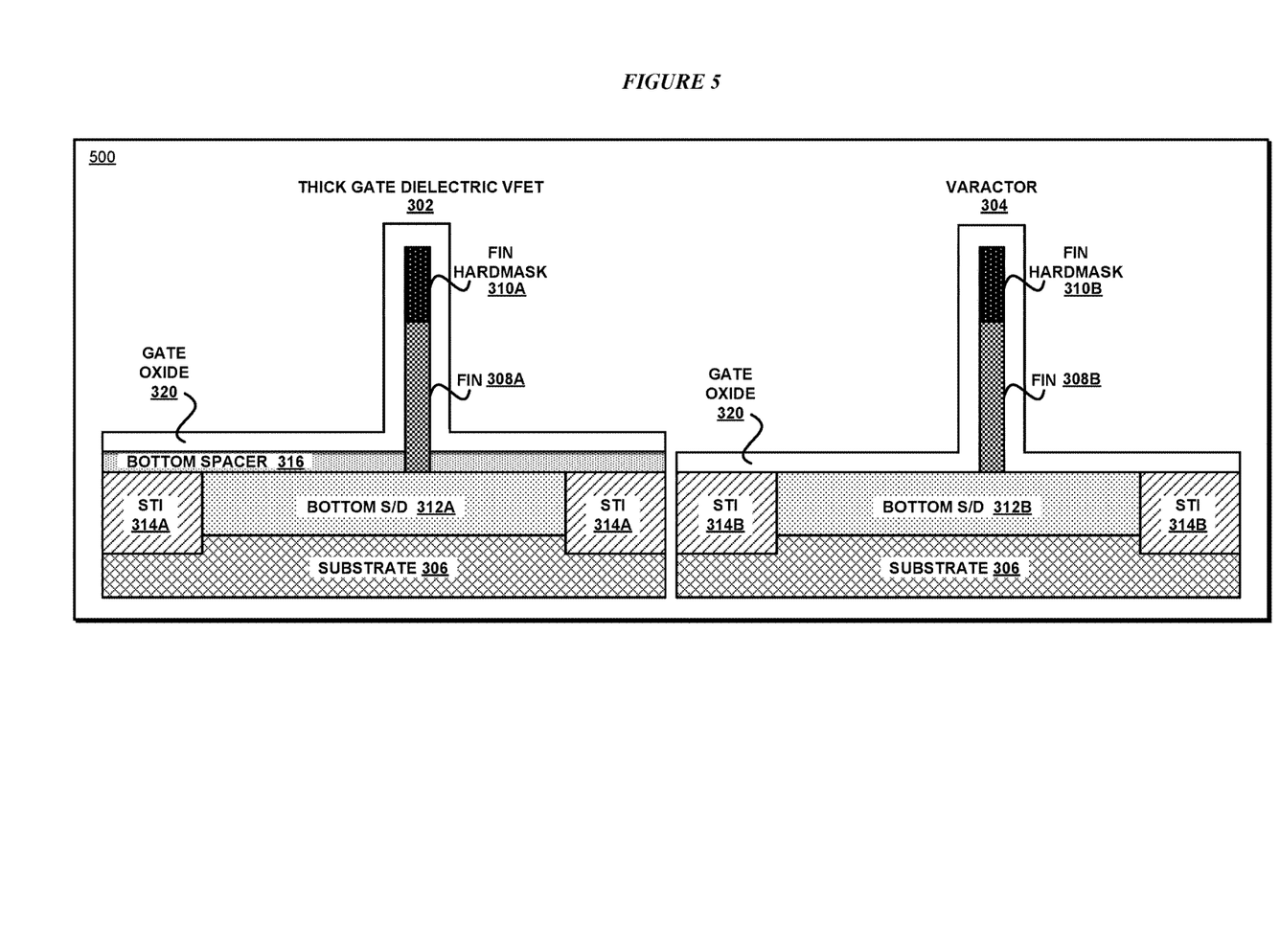
FIG. 5 depicts another portion of a process according to an illustrative embodiment.

With reference to FIG. 5, FIG. 5 depicts another portion of a process in which structure 500 is formed according to an illustrative embodiment. In the embodiment, fabrication system 107 strips block mask 318 from VFET region 302. In a particular embodiment, fabrication system 107 strips block mask 318 from VFET region 302 using a wet chemical photoresist stripping procedure or a dry plasma stripping procedure. As a result, bottom spacer 316 remains on VFET region 302 while bottom spacer 316 is removed from varactor region 304. In the embodiment, fabrication system 107 deposits a gate oxide 320 on VFET region 302 and varactor region 304. In various embodiments, fabrication system 107 deposits gate oxide 320 using an atomic layer deposition or other suitable deposition process such as chemical vapor deposition. In the embodiment, gate oxide 320 covers portions of bottom spacer 316, portions of first vertical fin 308A, and portions of first fin hardmask 310A within VFET region 302. Additionally, gate oxide 320 covers portions of STI 314B, portions of bottom S/D 312B, portions of second vertical fin 308B, and portions of second fin hardmask 310B within varactor region 304. Gate oxide 320 is used, in conjunction of additional gate dielectric formed in later process, to have a combined dielectric layers having a thickness that is greater than that of a thin gate dielectric layer. A thick gate dielectric allows for reduced gate leakage current and greater voltage swing capability in the resulting semiconductor device than that of a thin gate dielectric. In some embodiments, the thickness of the gate oxide 320 ranges from 2 nm to 6 nm. In particular embodiments, gate oxide 320 may be formed of silicon oxide, silicon oxynitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiment, the high-k dielectric may further include dopants such as lanthanum, aluminum.

Figure 6:
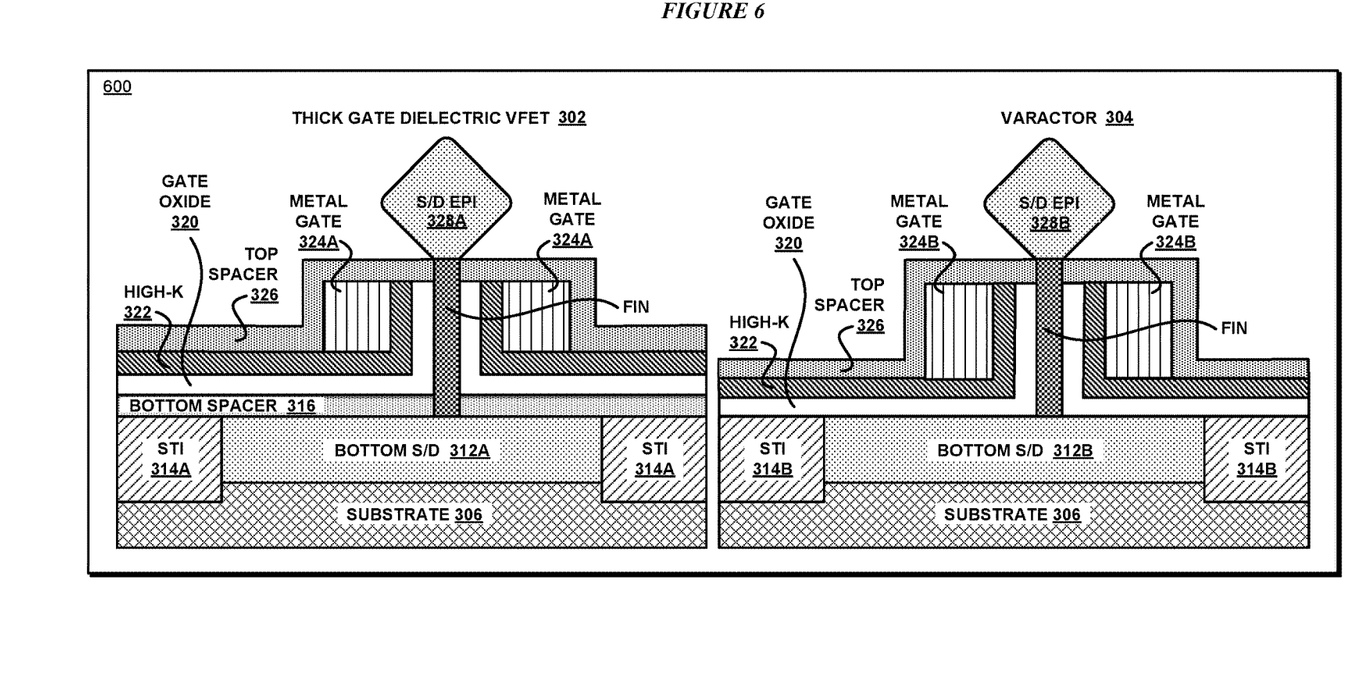
FIG. 6 depicts another portion of a process according to an illustrative embodiment.

With reference to FIG. 6, FIG. 6 depicts another portion of a process in which structure 600 is formed according to an illustrative embodiment. In the embodiment, fabrication system 107 deposits a high-k gate dielectric 322 on VFET region 302 and varactor region 304 to cover portions of gate oxide 320. In various embodiments, fabrication system 107 deposits high-k gate dielectric 322 using an atomic layer deposition or other suitable deposition process. In a particular non-limiting exemplary embodiment, high-k gate dielectric 322 has a thickness of 1.5-3 nm. Examples of high-k dielectric material include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum, aluminum, and magnesium.

In the embodiment, fabrication system 107 further deposits first metal gate 324A on each side of first vertical fin 308A upon high-K dielectric layer 322 within VFET region 302, and deposits second metal gate 324B on each side of second vertical fin 308B upon high-K dielectric layer 322 within varactor region 304. Non-limiting examples of metal gate material include a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material may further comprise dopants that are incorporated during or after deposition.

The metal gate may further comprise a workfunction metal layer that is used to set the transistor threshold voltage to a desired value. The work function layer may be a conductive nitride, including but not limited to titanium nitride (TiN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof.

In the embodiment, fabrication system 107 further forms top spacers 326 on high-K dielectric 322 and first metal gate 324A of VFET region 302 and on high-K dielectric 322 and second metal gate 324B of varactor region 304. In one or more embodiments, top spacers 326 are formed of a dielectric material such as silicon nitride. In a non-limiting exemplary embodiment, top spacers 326 have a thickness of 3-8 nm.

In the embodiment, fabrication system 107 further forms first top S/D 328A on first vertical fin 308A of VFET region 302 and second top S/D 328B on second vertical fin 308B of varactor region 304. As a result of the process of FIG. 6, a gate oxide VFET is fabricated within VFET region 302 and a high-voltage varactor is fabricated within varactor region 304 on common substrate 306. In one or more embodiments, fabrication system 107 forms first top S/D 328A and second top S/D 328B using an epitaxial process such as epitaxial growth, ion implantation, solid phase epitaxial re-growth (SPE), or laser-induced liquid phase epitaxial re-growth (LPE), or any suitable combination of these techniques.

Figure 7:
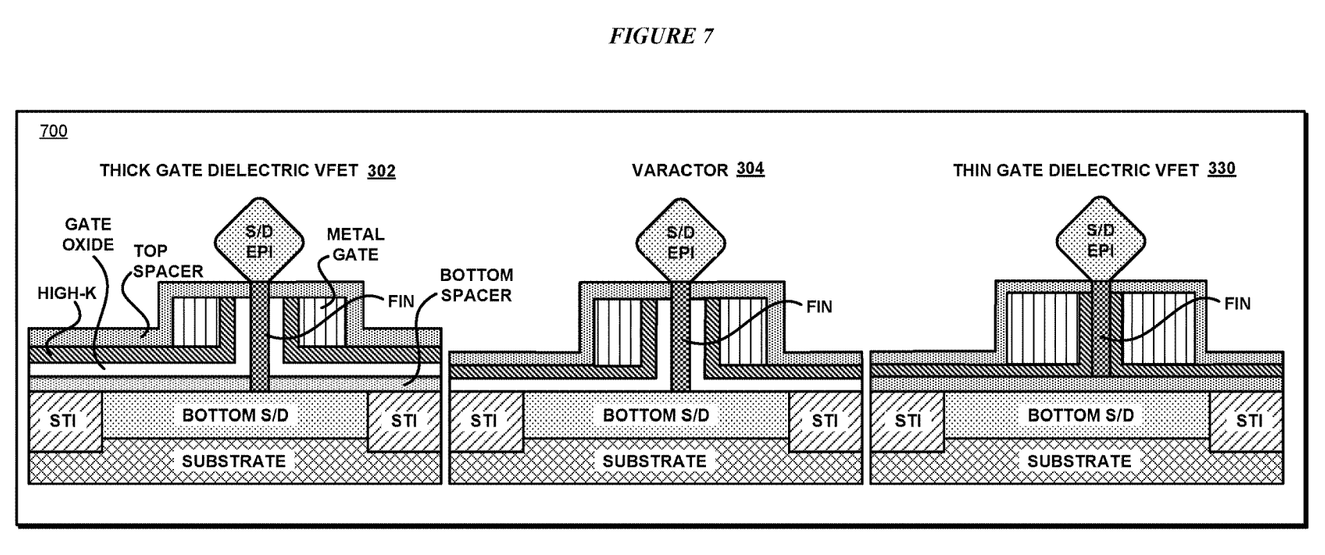
FIG. 7 depicts a gate oxide VFET, varactor, and thin gate dielectric VFET fabricated on a common substrate according to an illustrative embodiment.

With reference to FIG. 7, FIG. 7 depicts a thick gate dielectric VFET, varactor, and thin gate dielectric VFET fabricated on a common substrate according to an illustrative embodiment. In the illustrated embodiment, substrate structure 700 includes a gate oxide VFET within VFET region 302 and a high-voltage varactor within varactor region 304 fabricated on a common substrate in accordance with an embodiment of a process described with respect to FIGS. 3-6 above. In the embodiment, substrate structure 700 further includes a thin gate dielectric VFET region 330 including a thin gate dielectric VFET fabricated on the same common substrate during a same process as thick gate dielectric VFET within VFET region 302 and high-voltage varactor within varactor region 304. In the embodiment of FIG. 7, fabrication system 107 forms the same structure for thin gate dielectric VFET region 330 as described with respect to FIG. 3 for VFET region 302 and varactor region 304.

In the embodiment of FIG. 7, fabrication system 107 removes bottom spacer 316 from thin gate dielectric VFET region 330 during the same process as bottom spacer 316 is removed from varactor region 304. In the embodiment of FIG. 7, fabrication system 107 removes gate oxide 320 from thin gate dielectric VFET region 330 such that thin gate dielectric VFET region 330 is substantially free of gate oxide 320. In a particular embodiment, fabrication system 107 removes gate oxide 320 by a patterning process. In the embodiment of FIG. 7, fabrication system 107 forms gates, top spacers, and S/D for thin gate dielectric VFET region 330 in the manner as described with respect to FIG. 6 for VFET region 302 and varactor region 304. As a result of the process of FIG. 7, the thick gate dielectric VFET is fabricated within VFET region 302, the high-voltage varactor is fabricated within varactor region 304, and the thin gate dielectric VFET is fabricated within thin gate dielectric VFET region 330.

Figure 8:
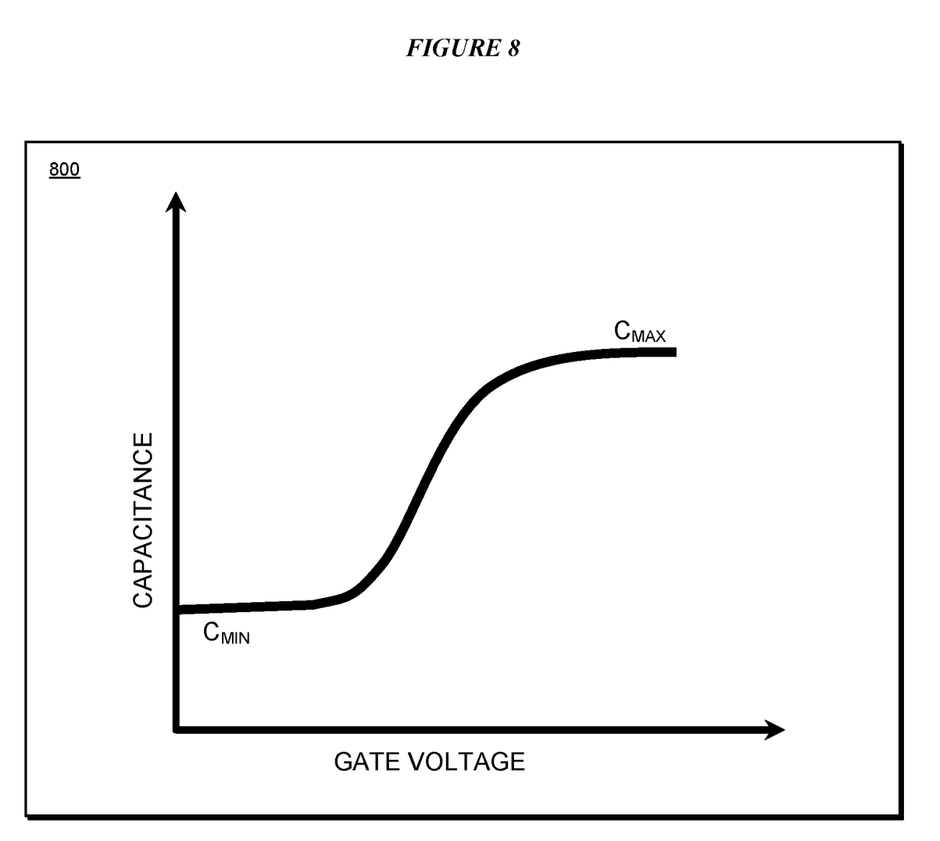
FIG. 8 depicts capacitance-gate voltage properties during operation of a varactor according to an illustrative embodiment.

FIG. 8 depicts capacitance-gate voltage properties during operation of a varactor according to an illustrative embodiment. In the illustrated embodiment, a varactor fabricated in accordance with an embodiment described with respect to FIG. 3-6 exhibits performance properties 800 shown in FIG. 8. As shown in FIG. 8, application of a low gate voltage produces a minimum capacitance value ($C_{MIN}$). The capacitance of the varactor increases as the gate voltage increases up to a maximum capacitance value ($C_{MAX}$). The total capacitance of the varactor is a combination of two capacitance components. The first component comes from the capacitance between gate and fin channel. This component varies as a function of gate voltage. The second component comes from the capacitance between the gate and the heavily doped source/drain. This component is virtually independent of gate voltage. For example, assume that the top and bottom S/D are heavily doped with n-type dopants.

When a low gate voltage is applied, the fin channel is fully depleted, so the capacitance contribution from fin channel is very low. The net capacitance of the varactor is primarily determined by the capacitance between gate and S/D. When a high gate voltage is applied, electrons are formed in fin channel, so the gate to fin channel capacitance increases. The net capacitance of the varactor increase due to the increase of gate-to-fin channel capacitance.

Figure 9:
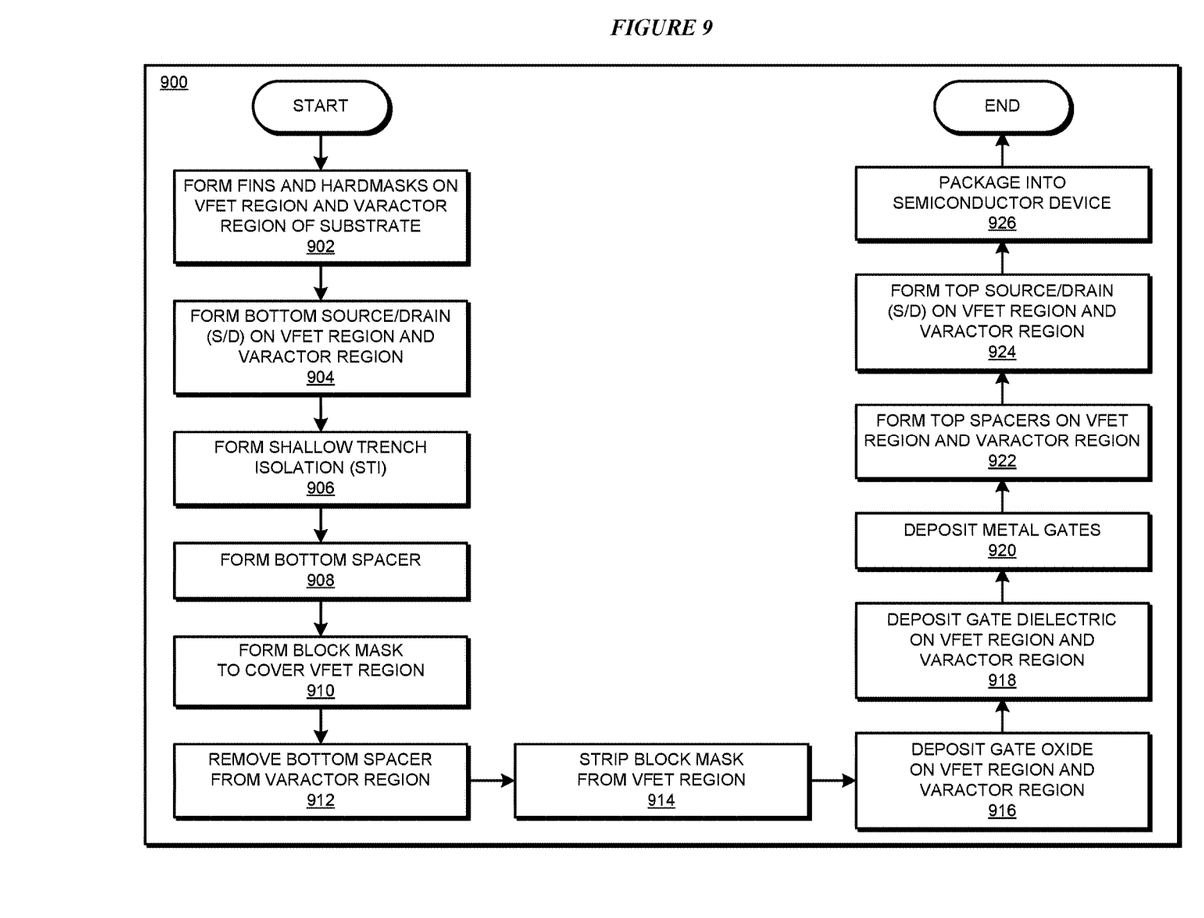
FIG. 9 depicts a flowchart of an example process for fabricating a VFET and varactor upon a common substrate in accordance with an illustrative embodiment.

With reference to FIG. 9, FIG. 9 depicts a flowchart of an example process 900 for fabricating a VFET and varactor upon a common substrate in accordance with an illustrative embodiment. In an embodiment, process 900 can be implemented in fabrication system 107 of FIG. 1 to perform one or more steps of FIGS. 3-7.

In block 902, fabrication system 107 forms first vertical fin 308A on VFET region 302 and second vertical fin 308B on varactor region 304 of substrate 306. Fabrication system 107 further forms first fin hardmask 310A on a top surface of first vertical fin 308A and second hardmask 310B on a top surface of second vertical fin 308B.

In block 904, fabrication system 107 forms first bottom source drain (S/D) 312A on VFET region 302 of substrate 306 and second bottom source drain (S/D) 312B on varactor region 304 of substrate 306. In block 906, fabrication system 107 forms first shallow trench isolation (STI) region 314A in VFET region 302 adjacent to first vertical fin 308A and second STI 314B region in varactor region 304 adjacent to second vertical fin 308B In particular embodiments, STI regions 314A-314B can be formed by any suitable process including, for example, lithography or etching to form trenches, and then filling the trenches with an insulating material, such as silicon dioxide.

In block 908, fabrication system 107 forms bottom spacer 316 on STI region 314A and bottom S/D 312A of VFET region 302 and STI region 314B and bottom S/D 312B of varactor region 304. In block 910, fabrication system 107 forms block mask 318 to cover VFET region 302 to protect the portion of bottom spacer 316 within VFET region 302. In block 312, fabrication system 107 removes a portion of bottom spacer 316 within varactor region 304 by a removal process. In an embodiment, fabrication system 107 removes the portion of bottom spacer 316 within varactor region 304 by an etching process. In a particular embodiment, the portion of bottom spacer 316 within varactor region 304 is removed using a reactive-ion etching (RIE) process.

In block 914, fabrication system 107 strips block mask 318 from VFET region 302. As a result, bottom spacer 316 remains on VFET region 302 while bottom spacer 316 is removed from varactor region 304. In block 916, fabrication system 107 deposits gate oxide 320 on VFET region 302 and varactor region 304. In the embodiment, gate oxide 320 covers portions of bottom spacer 316, portions of first vertical fin 308A, and portions of first fin hardmask 310A within VFET region 302. Additionally, gate oxide 320 covers portions of STI 314B, portions of bottom S/D 312B, portions of second vertical fin 308B, and portions of second fin hardmask 310B within varactor region 304.

In block 918, fabrication system 107 deposits a high-k gate dielectric 322 on VFET region 302 and varactor region 304 to cover portions of gate oxide 320. In block 920, fabrication system 107 further deposits first metal gate 324A on each side of first vertical fin 308A upon high-K dielectric layer 322 within VFET region 302, and deposits second metal gate 324B on each side of second vertical fin 308B upon high-K dielectric layer 322 within varactor region 304. In block 922, fabrication system 107 forms top spacers 326 on high-K dielectric 322 and first metal gate 324A of VFET region 302 and on high-K dielectric 322 and second metal gate 324B of varactor region 304.

In block 924, fabrication system 107 further forms top S/D 328A on first vertical fin 308A of VFET region 302 and top S/D 328B on second vertical fin 308B of varactor region 304. As a result a gate oxide VFET is fabricated within VFET region 302 and a high-voltage varactor is fabricated within varactor region 304 on common substrate 306. In block 926, fabrication system 107 packages the resultant semiconductor circuit structure into a semiconductor device. Process 900 then ends.

Thus, a computer implemented method, system or apparatus, and computer program product are provided in the illustrative embodiments for fabricating vertical transistors and high-voltage varactors on the same substrate on a common substrate and other related features, functions, or operations. Where an embodiment or a portion thereof is described with respect to a type of device, the computer implemented method, system or apparatus, the computer program product, or a portion thereof, are adapted or configured for use with a suitable and comparable manifestation of that type of device.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A method for fabricating a semiconductor device comprising:

receiving a substrate structure including a substrate, the substrate structure further including a first bottom source/drain and a first fin formed on a vertical transistor portion of the substrate and a second bottom source/drain and a second fin formed on a varactor portion of the substrate, the substrate structure further including a bottom spacer formed on the first bottom source/drain of the vertical transistor portion and the second bottom source/drain of the varactor portion;

applying a mask to the portion of the bottom spacer formed on the first bottom source/drain of the vertical transistor portion;
removing the portion of the bottom spacer formed on the second bottom source/drain of the varactor portion;
removing the mask from the portion of the bottom spacer formed on the first bottom source/drain of the vertical transistor portion; and
depositing a gate oxide on the vertical transistor portion and the varactor portion.

2. The method of claim 1, further comprising:
depositing a gate dielectric on the vertical transistor region and the varactor region;
forming a first metal gate on the gate dielectric of the vertical transistor region; and
forming a second metal gate on the gate dielectric of the varactor region.

3. The method of claim 2, further comprising:
forming a top spacer on the vertical transistor region and the varactor region.

4. The method of claim 1, further comprising:
forming a first top source/drain on the vertical transistor region; and
forming a second top source/drain on the varactor region.

5. The method of claim 4, wherein the first top source/drain and the second top source/drain are formed using an epitaxial process.

6. The method of claim 1, further comprising:
forming a first shallow trench isolation region adjacent to the first fin on the vertical transistor region; and
forming a second shallow trench isolation region adjacent to the second fin on the varactor region.

7. The method of claim 1, further comprising:
forming a first hardmask on the first fin; and
forming a second hardmask on the second fin.

8. The method of claim 1, wherein applying the mask includes forming the block mask on the portion of the bottom spacer formed on the first bottom source/drain of the vertical transistor portion.

9. The method of claim 1, wherein removing the portion of the bottom spacer formed on the second bottom source/drain of the varactor portion includes removing the portion of the bottom spacer formed on the second bottom source/drain using an etching process.

10. The method of claim 1, wherein removing the mask from the portion of the bottom spacer formed on the first bottom source/drain of the vertical transistor portion includes stripping the mask from the portion of the bottom spacer formed on the first bottom source/drain of the vertical transistor portion.

11. The method of claim 1, wherein the vertical transistor region includes a field effect transistor (FET).

12. The method of claim 11, wherein the FET is a thick gate dielectric VFET.

13. The method of claim 11, further comprising removing the gate oxide from the vertical transistor portion, wherein the FET is thin gate dielectric VFET.

14. The method of claim 1, wherein the varactor region includes a high-voltage varactor.

* * * * *